United States Patent [19]

Gailus

[11] Patent Number: 5,003,621
[45] Date of Patent: Mar. 26, 1991

[54] DIRECT CONVERSION FM RECEIVER

[75] Inventor: Paul H. Gailus, Prospect Heights, Ill.

[73] Assignee: Motorola, Inc., Schaumburg, Ill.

[21] Appl. No.: 430,467

[22] Filed: Nov. 2, 1989

[51] Int. Cl.$^5$ .............................................. H04B 1/30
[52] U.S. Cl. .................................. 455/209; 455/316; 455/324; 375/77
[58] Field of Search .............. 455/207, 208, 209, 214, 455/265, 263, 316, 324; 375/77, 97

[56] References Cited

U.S. PATENT DOCUMENTS

| | | | |
|---|---|---|---|
| 4,464,770 | 8/1984 | Maurer et al. | 455/265 |
| 4,639,682 | 1/1987 | Takeuchi | 455/208 |
| 4,653,117 | 3/1987 | Heck | 455/209 |
| 4,677,690 | 6/1987 | Reed | 455/209 |
| 4,733,403 | 3/1988 | Simone | 375/103 |
| 4,750,214 | 6/1988 | Hart et al. | 455/214 |
| 4,803,700 | 2/1989 | Dewey et al. | 375/77 |
| 4,817,167 | 3/1989 | Gassmann | 455/324 |
| 4,837,853 | 6/1989 | Heck | 455/209 |
| 4,852,123 | 7/1989 | Bickley | 455/259 |
| 4,857,928 | 8/1989 | Gailus et al. | 375/26 |

Primary Examiner—Reinhard J. Eisenzopf
Assistant Examiner—Lisa D. Charouel
Attorney, Agent, or Firm—Timothy W. Markison; Steven G. Parmelee; Joseph P. Krause

[57] ABSTRACT

A direct conversion FM receiver that comprises a quadrature mixer, an A to D converter, a digital demodulator, a digital phase lock loop, and frequency offset setting means is disclosed. The quadrature mixer receives FM signals and mixes them with a local oscillator signal to produce an analog in-phase baseband signal and an analog quadrature baseband signal. The analog in-phase baseband signal and the analog quadrature baseband signal are converted into digital signals by the A to D converter. The digitally converted baseband and quadrature signals are digitally demodulated and filtered by the digital demodulator such that modulation information is produced. The modulation information is used, at least in part, to control the phase lock loop means. In addition, the phase lock loop is offset by the frequency offsetting means such that the desensing components of the analog devices are minimized, thus, substantially reducing the need for tight component tolerance of DC sensing components and the need for manufacturing adjustments of DC desensing components.

4 Claims, 1 Drawing Sheet

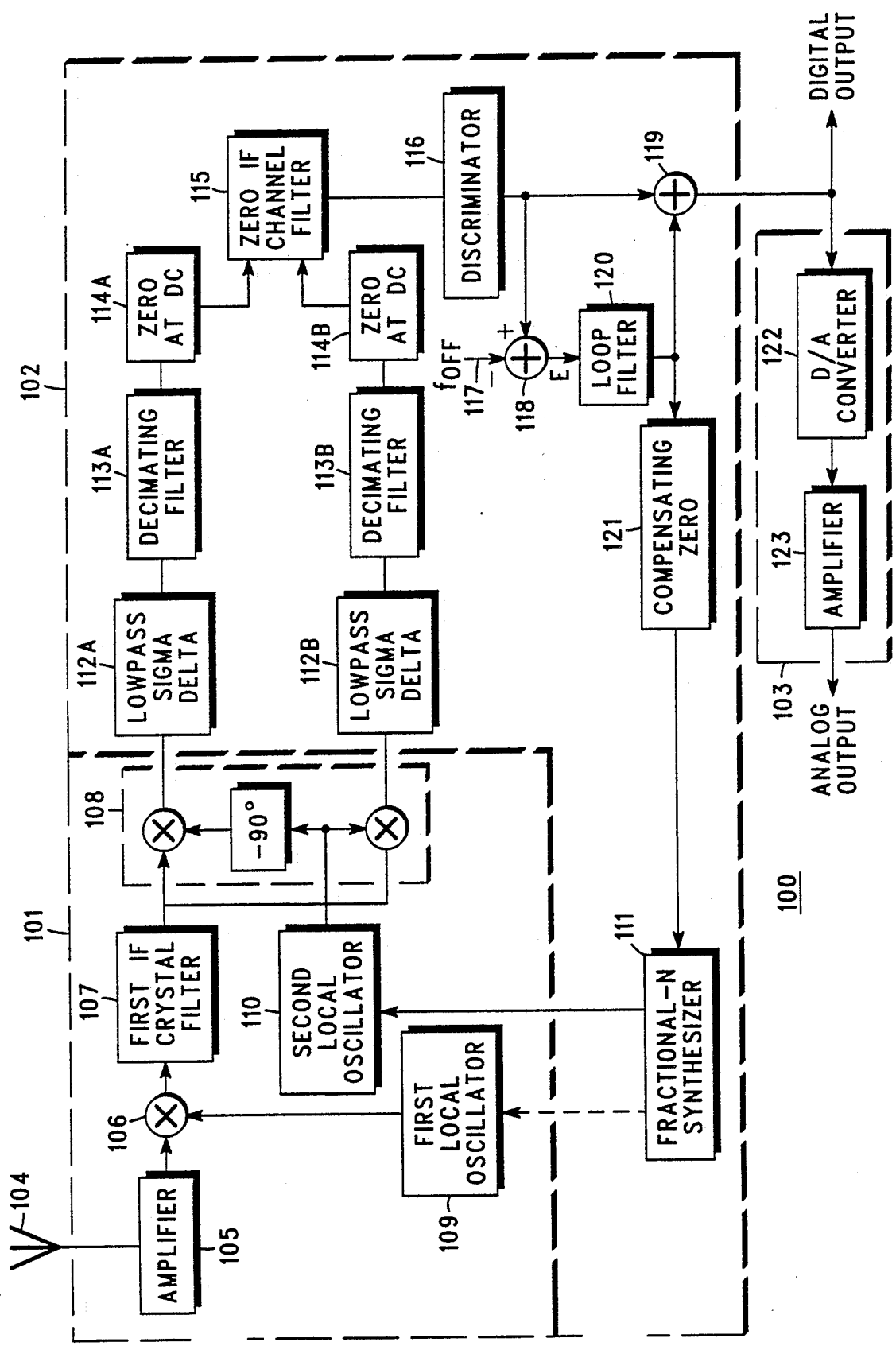

DIRECT CONVERSION FM RECEIVER

TECHNICAL FIELD

The present invention relates generally to frequency modulated (FM) receivers and in particular to an analog-digital implementation of a direct conversion FM receiver.

BACKGROUND OF THE ART

Typically, a direct conversion FM receiver converts a received FM signal into a baseband (zero-IF) signal by mixing the received FM signal with a local oscillator (LO) having a frequency substantially equal to the carrier frequency. The baseband signal is then demodulated to recover modulation information. A direct conversion FM receiver may implement the mixing process in one stage, single conversion, or in multiple stages, such as dual conversion.

Single conversion zero-IF receivers have several inherent problems, such as local radiation resulting from the mixing process, desensing of nearby receivers, desensitization by DC offsets or carrier attenuation when AC coupling is used, generation of beat notes if the baseband paths are imperfectly matched, and not providing means for adequately limiting the baseband signal. The use of a dual conversion receiver eliminates several of the inherent problems of the single conversion receiver but still does not provide means for adequately limiting the baseband signal, does not eliminate the desensitization by DC offsets, nor does it eliminate the generation of beat notes.

There are several solutions to the above mentioned problems of the dual conversion receiver. For example, U.S. Pat. No. 4,653,117 assigned to Motorola, Inc., discloses an analog solution, U.S. Pat. No. 4,733,403, assigned to Motorola, Inc. and issued patent application Ser. No. 06/890,804, assigned to Motorola, Inc., disclose digital solutions, and U.S. Pat. No. 4,464,770, discloses an analog-digital solution. The analog solution of patent '117, discloses a dual conversion FM receiver using phase locked direct conversion IF that up-converts the baseband signal to a non-zero IF for amplification, limiting and demodulation. The disclosed FM receiver comprises a quadrature baseband mixing section, followed by an up-conversion section which also amplifies and limits the up-conversion signal, and a phase lock section which precisely centers the zero-IF signal and demodulates the received signal. The gain of the circuit which centers the zero-IF signal (low frequency path) and the demodulation gain (high frequency path) must match to obtain a flat baseband response, thus, component tolerances are critical. Even with tight component tolerances, manufacturing adjustments are usually required to obtain a flat baseband response.

The digital solution of patent '403, discloses a digital zero-IF selectivity section which operates on a recovered input signal. The disclosed invention eliminates the needed up-conversion of the analog solution and improves the selectivity of a conventional dual conversion receiver, but relies on external circuitry to provide the input signal in a digital format. Typically, the external circuitry must operate at a very high sampling rate and is relatively expensive in comparison with analog mixers. The digital solution of issued patent application Ser. No. 06/890,804 discloses a digital radio frequency (RF) receiver which is completely implemented with digital circuitry. The digital RF receiver eliminates the problems of a conventional dual conversion receiver and overcomes several problems of digital receivers such as high sampling rates, resolution in A/D steps, and receiving low level RF analog signals. Nevertheless, at present, the disclosed digital RF receiver is relatively more expensive than a completely analog receiver.

The analog-digital solution disclosed in patent '770 discloses a radio receiver with an analog high frequency single conversion section followed by a digital low frequency section. This invention overcomes the need for high speed digital circuitry, thus reducing the cost, but does not mention overcoming some of the above mentioned inherent problems of a single conversion receiver and further depends on imprecise analog components to determine the recovered baseband response.

Therefore, a need exists for an FM receiver which utilizes the benefits of digital circuitry as well as analog circuitry while overcoming the problems of each implementation.

SUMMARY OF THE INVENTION

These needs and others are substantially met by the direct conversion FM receiver disclosed herein. The direct conversion FM receiver comprises a frequency locked loop including at least one quadrature mixer, analog to digital converters, notch filters at DC (zeros at DC), a demodulator, a digitally controlled phase lock loop, and a frequency offset generator. The quadrature mixer mixes received FM signal with at least one intermediate signal such that an analog in-phase baseband signal and an analog quadrature baseband signal are produced. The analog in-phase baseband signal and the analog quadrature baseband signal are converted to digital signals by the A/D converters. The zeros at DC eliminate desensing caused by DC offsets. The digital in-phase baseband signal and the digital quadrature baseband signal are demodulated and digitally filtered to recover digital modulation information. The baseband signal is digitally remodulated by the phase locked loop to a frequency offset, generated by the frequency offset generator, from the original received signal. Further, the use of the above mentioned digital components closely matches the gains in the low frequency path and high frequency path without tight component tolerances and without manufacturing adjustments.

In an embodiment of the present invention the phase lock loop comprises a voltage control oscillator which receives digital input and produces an analog output. Further, the frequency offset synthesizer generates an offset frequency in the range of 10 to 100 Hertz.

BRIEF DESCRIPTION OF THE DRAWING

FIG. 1 comprises a block diagram of a direct conversion receiver that implements the disclosed invention.

DETAILED DESCRIPTION OF THE PREFERRED EMBODIMENT

FIG. 1 illustrates a direct conversion FM receiver (100) according to the disclosed invention. The FM receiver (100) comprises an analog section (101), a digital section (102), and an output section (103). The analog section (101) comprises an antenna (104), an amplifier (105), a first mixer (106), a first IF filter (107), a quadrature mixer (108), a first local oscillator (109), and a second local oscillator (110). The digital section (102) comprises a fractional-n synthesizer (111), two low pass sigma delta analog to digital converters (112a and 112b), two decimating filters (113a and 113b), two digitally implemented zeros at DC (114a and 114b), a zero IF channel filter (115), a discriminator (116), a frequency offset generator (117), an offset summer (118), an output summer (119), a loop filter (120), and a digitally implemented compensating zero (121). The fractional-n synthesizer (111) and the compensating zero (121) comprise, at least part of, the low frequency path, while the discriminator (116) and the zero IF channel filter (115) comprise, at least part of, the high frequency path. The output section (103) comprises a D to A filter (122) and an amplifier (123).

The FM receiver (100) receives FM signals via the antenna (104), where the received FM signal contains modulation information, which may be analog information (typically audio or ultrasonic), digital information, or both. The received FM signal is amplified by the amplifier (105) and mixed with a first local oscillator frequency in the first mixer (106) to produce an intermediate signal. The first mixer (106) may be a quadrature mixer if higher noise immunity, or image rejection, is required. Additionally, the first local oscillator frequency may equal the carrier frequency of the received FM signal such that the intermediate signal is a baseband zero-IF signal; however, at present, a dual conversion is considered to be the best mode. The intermediate signal is filtered by the first IF filter (107) and mixed with a second local oscillator frequency by the quadrature mixer (108), such that the resultant signals are an analog in-phase baseband signal and an analog quadrature baseband signal. The operation of a quadrature mixer is well understood in the art and will not be discussed herein.

The analog in-phase baseband signal and the analog quadrature baseband signal are converted to high sampling rate digital signals by the lowpass sigma-delta converter (112a and 112b). The high sampling rate digital signals are reduced to lower sampling rate digital signals by the decimating filters (113a and 113b). Thus, the current drain and speed requirements of the following digital circuitry are reduced. The digital in-phase baseband signal and the digital quadrature baseband signal pass through the zeros at DC (114a and 114b). The zeros at DC (114a and 114b) will be discussed below. The digital inphase baseband signal and the digital quadrature baseband signal are combined and filtered in the zero-IF filter (115) which provides receiver selectivity. The combined signal is demodulated in the discriminator (116) to produce received digital modulation information. The discriminator (116) comprises a digital implementation such as that disclosed in U.S. Pat. No. 4,675,882, assigned to Motorola, Inc.

The output of the discriminator (116) is coupled to the summer (118) and the output summer (119). The summer (118) adds the digital modulation information with information provided by the frequency offset generator (117). The information provided by the frequency offset generator (117) causes the baseband signal to be offset from zero by a frequency in the range of 10 Hertz to 100 Hertz. The output of the summer (118) is filtered by the loop filter (120) and is coupled to the output summer (119) and the compensating zero (121). The output summer (119) adds the loop filter output (low frequency path) to the digital modulation information (high frequency path) and the resultant is coupled to the output section (103) such that low frequency modulation components that were filtered out are restored. By having the low frequency path and the high frequency path implemented substantially with digital circuitry, the baseband response is flat without tight component tolerances or manufacturing adjustments. The output section (103) converts the resultant to an analog signal in the D/A converter (122), if the modulation information contains analog (audio or ultrasonic) information, and amplifies the signal in the amplifier (123).

The output of the compensating zero (121) is coupled to the fractional-n synthesizer (111) which produces a phase locking signal to the first or the second local oscillator (109 and 110) such that the oscillator output is offset from its respective mixer input. The fractional-n synthesizer (111) comprises a digital implementation that yields a substantially analog output as disclosed in co-pending patent application Ser. No. 07/328,834, assigned to Motorola, Inc. The output of the fractional-n synthesizer (111) may be coupled to either the first local oscillator (109) or the second local oscillator (110), depending on design preference. By having an offset of 10 Hertz to 100 Hertz, the DC components from circuit imperfections that normally would desense the discriminator (116) are eliminated by the digitally implemented zeros at DC (114a and 114b) with negligible effects on the desired carrier signal. Additionally, the compensation zero (121) is selected such that it cancels an inherent pole of the fractional-n synthesizer (111).

To further enhance the performance of the fractional-n synthesizer (111), an interpolating filter may be used. The interpolating filter increases the sampling rate of the output signal of the compensating zero (121). With an increased sampling rate, the fractional-n synthesizer (111) improves signal image rejection at harmonics of the sampling rate.

By having the digital section comprised of substantially digital components, the baseband response is flat and the low frequency path and the high frequency path have closely matched gains without the need for tight component tolerances or manufacturing adjustments. In addition to the elimination of tight component tolerances and the need for manufacturing adjustments, the present invention reduces the baseband response variation, in decibels, due to analog component drift by a factor of ten.

What is claimed is:

1. A direct conversion frequency modulated (FM) receiver for recovering modulation information from received FM signals comprising:

quadrature mixing means for mixing the received FM signals with at least one local oscillator signal to produce, at baseband, an analog in-phase baseband signal and an analog quadrature base band signal;

analog-to-digital (A/D) means, coupled to the quadrature mixing means, for converting the analog in-phase baseband signal into a digital baseband signal and for converting the analog quadrature baseband signal into a digital quadrature baseband signal;

demodulation means, coupled to the A/D means, for digitally demodulating and digitally filtering the digital in-phase baseband signal and the digital quadrature baseband signal to produce digital modulation information;

phase lock loop means, coupled to the demodulation means and the quadrature mixing means, for digitally generating the at least one local oscillator signal, such that at least one local osciallator signal is at least partially dependent on the digital modulation information; and frequency offset means, coupled to the demodulation means and the phase lock loop means, for digitally offsetting the at least one local oscillator signal such that a need for tight component tolerance of DC desensing components or manufacturing adjustments of the DC desensing components are substantially eliminated.

2. The FM receiver of claim 1 further comprises at least one digitally implemented notch filter at DC, operably associated with the demodulation means and the A/D means, for substantially eliminating DC offset components with negligible effects on the digital in-phase baseband signal and the digital quadrature baseband signal.

3. A method for receiving frequency modulated (FM) signals to produce received FM signals and recovering modulation information comprising the steps of:

(a) mixing the received FM signals with at least one local osciallator signal to produce, at baseband, an analog in-phase baseband signal and an analog quadrature baseband signal;

(b) converting the analog in-phase baseband into a digitally in-phase baseband signal and converting the analog quadrature baseband signal into a digital quadrature baseband signal;

(c) demodulating the digital in-phase baseband and the digital quadrature baseband signal to produce digital modulation information;

(d) locking frequency of the at least one local oscillator signal with, at least in part, frequency of the digital modulation information; and (e) offsetting the at least one local oscillator signal by a predetermined offset frequency such that a need for tight component tolerance of DC desensing components or manufacturing adjustments of the DC desensing components are substantially eliminated.

4. The method of claim 3 further comprises converting the digital modulation information into analog modulation information.

* * * * *